(12) United States Patent
Wang (10) Patent No.: US 12,207,420 B2
(45) Date of Patent: Jan. 21, 2025

(54) SUPPORT COMPONENT AND FLEXIBLE DISPLAY MODULE

(71) Applicant: Wuhan China Star Optoelectronics Semiconductor Display Technology Co., Ltd., Hubei (CN)

(72) Inventor: Wenqiang Wang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/598,309

(22) PCT Filed: Aug. 9, 2021

(86) PCT No.: PCT/CN2021/111401
§ 371 (c)(1),
(2) Date: Sep. 27, 2021

(87) PCT Pub. No.: WO2023/000399
PCT Pub. Date: Jan. 26, 2023

(65) Prior Publication Data
US 2024/0049406 A1    Feb. 8, 2024

(30) Foreign Application Priority Data
Jul. 20, 2021 (CN) .......................... 202110817830.3

(51) Int. Cl.
*H05K 5/02* (2006.01)
(52) U.S. Cl.
CPC ..................................... *H05K 5/02* (2013.01)

(58) Field of Classification Search
None
See application file for complete search history.

(56) References Cited

U.S. PATENT DOCUMENTS

| 11,581,506 B2* | 2/2023 | Wang | H10K 77/111 |
| 2014/0226275 A1* | 8/2014 | Ko | G06F 1/1601 |
| | | | 361/679.27 |

(Continued)

FOREIGN PATENT DOCUMENTS

| CN | 106252378 | 12/2016 |
| CN | 107863452 | 3/2018 |

(Continued)

OTHER PUBLICATIONS

International Search Report and the Written Opinion Dated Mar. 29, 2022 From the International Searching Authority Re. Application No. PCT/CN2021/111401 and Its Translation Into English. (19 Pages).

(Continued)

*Primary Examiner* — James Wu
*Assistant Examiner* — Christopher L Augustin (57) ABSTRACT

The present disclosure provides a support component and a flexible display module. The support component includes a support layer. The support layer has a patterned structure in a bending area. The patterned structure includes two first hollow patterns. The first hollow pattern includes a plurality of support blocks and a plurality of first hollow parts. An opening is formed at a corresponding first edge close to each of the plurality of first hollow parts, when the support layer is in a bending state, the opening shrinks to a closed state.

19 Claims, 6 Drawing Sheets

(56) References Cited

U.S. PATENT DOCUMENTS

| | | | |
|---|---|---|---|
| 2016/0226015 A1 | 8/2016 | Kauhaniemi et al. | |
| 2019/0207141 A1* | 7/2019 | Kim | H10K 77/111 |
| 2020/0166974 A1 | 5/2020 | Ai et al. | |
| 2020/0319043 A1 | 10/2020 | Rosenberg et al. | |
| 2020/0319672 A1* | 10/2020 | Kim | G06F 1/1656 |
| 2021/0116975 A1 | 4/2021 | Moon | |
| 2021/0165454 A1* | 6/2021 | Dong | G06F 1/1652 |
| 2021/0259119 A1* | 8/2021 | Seo | H05K 5/0217 |
| 2022/0343809 A1* | 10/2022 | Chen | G09F 9/301 |
| 2023/0179690 A1* | 6/2023 | Lv | G06F 1/1616 |
| | | | 455/566 |

FOREIGN PATENT DOCUMENTS

| | | |
|---|---|---|
| CN | 107886846 | 4/2018 |
| CN | 110335546 | 10/2019 |
| CN | 110660325 | 1/2020 |
| CN | 110992828 | 4/2020 |
| CN | 210606374 | 5/2020 |
| CN | 210627726 | 5/2020 |
| CN | 111477107 | 7/2020 |
| CN | 111508370 | 8/2020 |
| CN | 111640775 | 9/2020 |
| CN | 112002229 | 11/2020 |
| CN | 211928943 | 11/2020 |
| CN | 112289750 | 1/2021 |
| CN | 213070424 | 4/2021 |
| CN | 112991948 | 6/2021 |
| CN | 113066832 | 7/2021 |
| CN | 112513961 | 1/2023 |

OTHER PUBLICATIONS

Notification of Office Action and Search Report Dated Jan. 29, 2022 From The State Intellectual Property Office of the People's Republic of China Re. Application No. 202110817830.3 and Its Translation Into English. (11 Pages).

* cited by examiner

SUPPORT COMPONENT AND FLEXIBLE DISPLAY MODULE

RELATED APPLICATIONS

This application is a National Phase of PCT Patent Application No. PCT/CN2021/111401 having International filing date of Aug. 9, 2021, which claims the benefit of priority of Chinese Patent Application No. 202110817830.3 filed on Jul. 20, 2021. The contents of the above applications are all incorporated by reference as if fully set forth herein in their entirety.

FIELD AND BACKGROUND OF THE INVENTION

The present application relates to the field of display technology, and particularly to a support component and a flexible display module.

An organic light-emitting diode (OLED) module stack is bond by a plurality of film layers and glue layers. Generally speaking, in order to ensure an overall flatness of a module, a thin steel use stainless plate (SUS, a steel use stainless code) is usually configured as a support layer for a bottom layer adjacent to the OLED module stack. However, a modulus of the support layer is significantly different from the film layer and the glue layer, and is usually 100 to 1000 times apart. A peeling phenomenon between the film layers often occurs due to an uncoordinated deformation of a force during a bending process. In order to improve this failure phenomenon, a bending area of an entire support layer is usually made into a grid shape, that is, a patterned structure. Compared with the entire support layer, this solution effectively solves the peeling phenomenon, and reduces a bending rigidity of the support layer in the bending area of the module, and improves an overall bending performance of the module.

However, under this design, water vapor can easily invade into the film layers and the glue layers from side holes of a substructure disposed on an edge of the support layer, which can easily cause the film layers and the glue layers to fail, and the water vapor can easily invade into an encapsulation layer under extreme environmental conditions, and then affect a service life of the module.

In summary, there is an urgent need to provide a support component and a flexible display module to solve above technical problems.

SUMMARY OF THE INVENTION

Embodiments of the present disclosure provide a support component and a flexible display module to solve a technical problem that water vapor easily invades film layers and glue layers from side hole positions of an existing edge substructure of a support layer, which affects a service life of the module.

In order to solve the problem, a technical solution provided by the present disclosure is:

The present disclosure provides a support component for supporting a flexible display panel, wherein the support component comprises:
a support layer, and the support layer comprises:
at least one bending area, and
non-bending areas disposed between two sides of the bending area;
wherein the support layer has a patterned structure in the bending area, and the patterned structure comprises:
two first edges perpendicular to a bending axis of the bending area, and
two first hollow patterns respectively disposed at the two first edges, wherein the hollow patterns comprises a plurality of support blocks and a plurality of first hollow parts, and the plurality of support blocks are disposed along a direction perpendicular to the bending axis, and each of the plurality of first hollow parts is disposed between two adjacent support blocks, and an opening is formed at a corresponding first edge close to each of the plurality of first hollow parts, when the support layer is in a bending state, the opening shrinks to a closed state.

According to the support component provided by the present disclosure, wherein, a width of the first hollow part in a direction perpendicular to the bending axis gradually decreases along a direction approaching the corresponding first edge.

According to the support component provided by the present disclosure, the width of the first hollow part in the direction perpendicular to the bending axis decreases linearly along the direction approaching the corresponding first edge.

According to the support component provided by the present disclosure, the first hollow part comprises:
a first sub-hollow part and a second sub-hollow part disposed in a direction parallel to the bending axis and connected to each other, wherein the first sub-hollow part is away from the corresponding first edge, and the second sub-hollow part is close to the corresponding first edge;
wherein in a direction close to the corresponding first edge, a width of the first sub-hollow part in a direction perpendicular to the bending axis is a first width, and a width of the second sub-hollow part in a direction perpendicular to the bending axis is a second width;
wherein the first width is greater than or equal to the second width, and the first width gradually decreases, and the second width remains unchanged.

According to the support component provided by the present disclosure, the first hollow part has a symmetrical pattern, and a symmetry axis of the first hollow part is parallel to the bending axis.

According to the support component provided by the present disclosure, wherein, a width of the first hollow part at the corresponding first edge and in a direction perpendicular to the bending axis is less than or equal to 60 microns.

According to the support component provided by the present disclosure, the width of the first hollow part at the corresponding first edge and in the direction perpendicular to the bending axis ranges from 20 microns to 60 microns.

According to the support component provided by the present disclosure, wherein, the non-bending area comprises two second edges perpendicular to the bending axis, and a gap disposed between the first edge and one second edge disposed on a same side with the first edge.

According to the support component provided by the present disclosure, a width of the gap in a direction parallel to the bending axis is less than or equal to 0.75 mm.

According to the support component provided by the present disclosure, the gap is filled with a glue layer with low moisture permeability and low modulus properties.

According to the support component provided by the present disclosure, the patterned structure further comprises a second hollow pattern, and two ends of the second hollow pattern are respectively connected to one first hollow pattern.

According to the support component provided by the present disclosure, the second hollow pattern comprises a plurality of sub-hollow patterns repeatedly disposed along the bending axis.

According to the support component provided by the present disclosure, each of the plurality of sub-hollow patterns comprises a main body part and a plurality of second hollow parts, wherein the plurality of second hollow parts in each of the plurality of sub-hollow patterns connecting a corresponding first hollow pattern are in one-to-one correspondence with the plurality of first hollow parts in the corresponding first hollow pattern, and the plurality of second hollow parts in two adjacent sub-hollow patterns are connected in one-to-one correspondence.

According to the support component provided by the present disclosure, in a direction parallel to the bending axis, a length of the second hollow part is greater than or equal to a length of the first hollow part, and the length of the second hollow part is less than or equal to 1.2 times the length of the first hollow part; wherein, in a direction perpendicular to the bending axis, a maximum width of the first hollow part not greater than a width of the second hollow part.

According to the support component provided by the present disclosure, a width of the second hollow part in a direction perpendicular to the bending axis ranges from 180 microns to 220 microns.

According to the support component provided by the present disclosure, each of the plurality of sub-hollow patterns further comprises a plurality of third hollow parts; wherein, in a direction perpendicular to the bending axis, the plurality of third hollow parts and the plurality of second hollow parts in each of the plurality of sub-hollow patterns are alternately disposed, and each of the plurality of third hollow parts corresponds to two second hollow parts disposed at intervals.

According to the support component provided by the present disclosure, hollow parts of the first hollow pattern and the two second hollow patterns are filled with a glue layer with low moisture permeability and low modulus properties.

According to the support component provided by the present disclosure, the support component further comprises a protective film, and the protective film is disposed on a side of the support layer away from the flexible display panel, and covers at least part of the support layer corresponding to the bending area.

According to the support component provided by the present disclosure, the support component further comprises a reinforcement layer disposed on a side of the protective film away from the support layer.

The present disclosure provide a flexible display module, comprising:
  a flexible display panel; and
  a supporting component disposed on one side of the flexible display panel and configured to support the flexible display panel, and the supporting component comprises:
    a support layer, and the support layer comprises:
    at least one bending area, and
    non-bending areas disposed between two sides of the bending area;
    wherein the support layer has a patterned structure in the bending area, and the patterned structure comprises:
      two first edges perpendicular to a bending axis of the bending area, and
      two first hollow patterns respectively disposed at the two first edges, wherein the hollow patterns comprises a plurality of support blocks and a plurality of first hollow parts, and the plurality of support blocks are disposed along a direction perpendicular to the bending axis, and each of the plurality of first hollow parts is disposed between two adjacent support blocks, and an opening is formed at a corresponding first edge close to each of the plurality of first hollow parts, when the support layer is in a bending state, the opening shrinks to a closed state.

The beneficial effects are: the support component and the flexible display module provided by the present disclosure. The support component includes the support layer. The support layer has the patterned structure in the bending area. The patterned structure includes two first hollow patterns respectively disposed at the first edge, and the first hollow pattern includes a plurality of support blocks and a plurality of first hollow parts. The plurality of support blocks are disposed along the direction perpendicular to the bending axis. Each first hollow part is disposed between two adjacent support blocks, and each first hollow part forms the opening near the adjacent first edge. When the support layer is in the bending state, the opening shrinks to close, thereby reducing the probability of the water vapor and dust intruding into the flexible display module when the flexible display module is bent, and improving a display life of the flexible display module.

100. Support component; 1. Support layer; 1a, Bending area; 1b, Non-bending area; 2. Adhesive layer; 3.

Protection film; 4. Reinforcing layer; 10. First hollow pattern; 11. Bending axis; 12, First edge; 13, Second edge; 14, Gap; 101, Support block; 102, first hollow part; 1021, Opening; 1022, First sub-hollow part; 1023. Second sub-hollow part; 20. Second hollow pattern; 20a, sub-hollow pattern; 201, Main body part; 202, Second hollow part; 2021, First arc hollow part; 2022, First strip hollow part; 203, Third hollow part; 2031. Second arc hollow part, 2032, Third arc hollow part; 2033, Second strip hollow part; 200. Flexible display panel.

DESCRIPTION OF SPECIFIC EMBODIMENTS OF THE INVENTION

Technical solutions in the embodiments of the present disclosure will be clearly and completely described below in conjunction with drawings in embodiments of the present disclosure. Obviously, described embodiments are only a part of the embodiments of the present disclosure, rather than all embodiments. Based on the embodiments of the present disclosure, all other embodiments obtained by those skilled in the art without creative work shall fall within a protection scope of the present configured to limit the disclosure. In the disclosure, unless otherwise stated, directional words used such as "upper" and "lower" generally refer to upper and lower directions of a device in actual use or working state, and specifically refer to drawing directions in the drawings. And "inner" and "outer" refer to an outline of the device.

Figure 3:
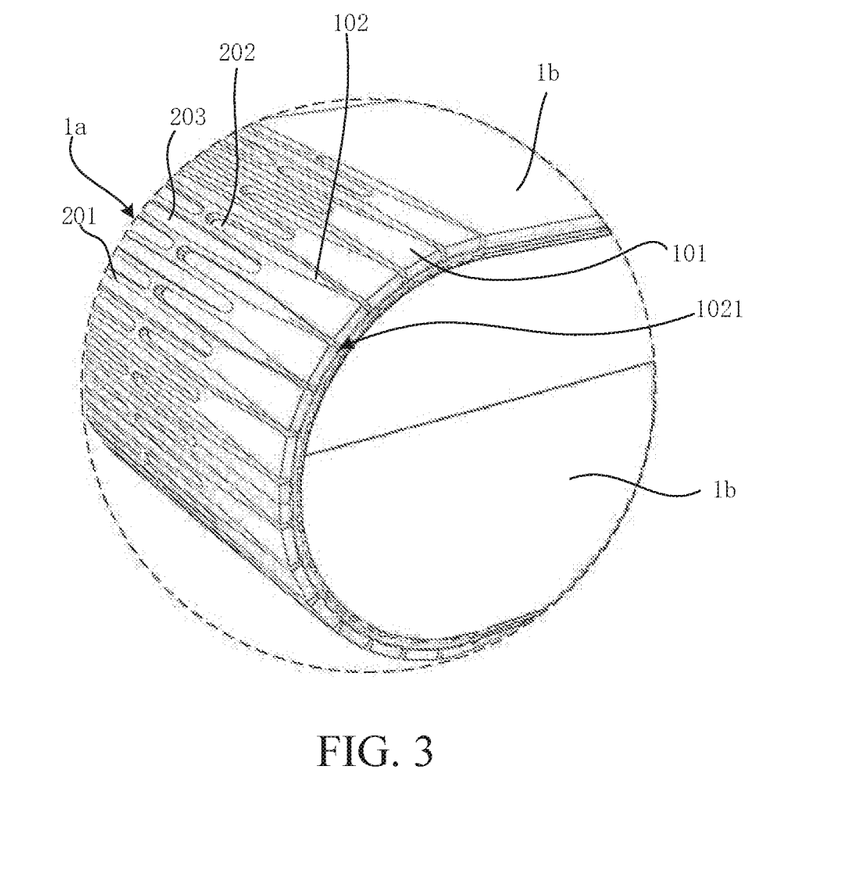
FIG. 3 is a structural schematic diagram of a support module in a bending state according to an embodiment of the present disclosure.
Figure 4:
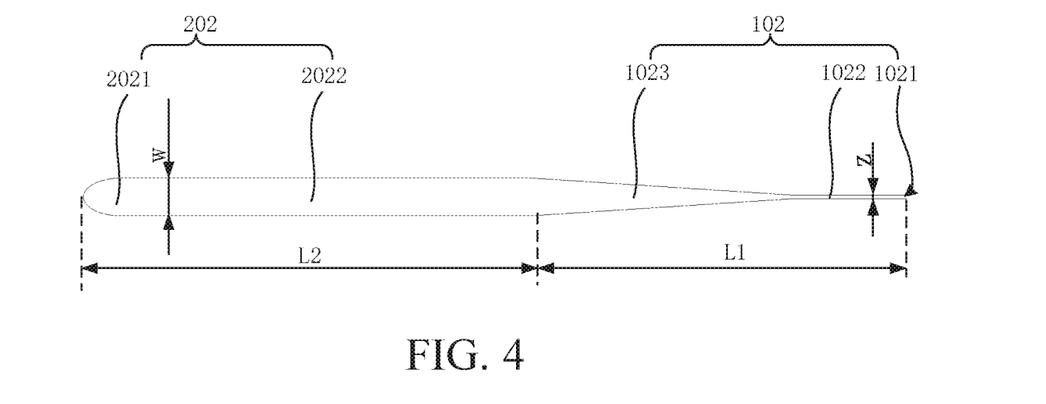
FIG. 4 is a structural schematic diagram of a first hollow part and a second hollow part according to an embodiment of the present disclosure.
Figure 5:
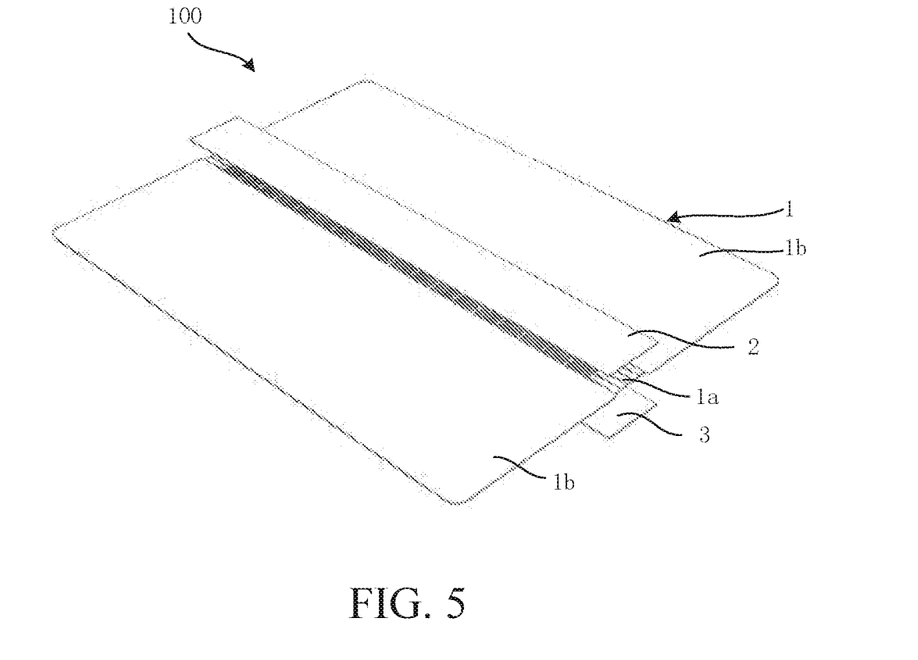
FIG. 5 is a structural schematic diagram of the support component according to an embodiment of the present disclosure.

Please refer to FIG. 1 to FIG. 5, FIG. 1 is a planar structural schematic diagram of a support layer according to an embodiment of the present disclosure. FIG. 5 is a structural schematic diagram of the support component according to an embodiment of the present disclosure.

Figure 1:
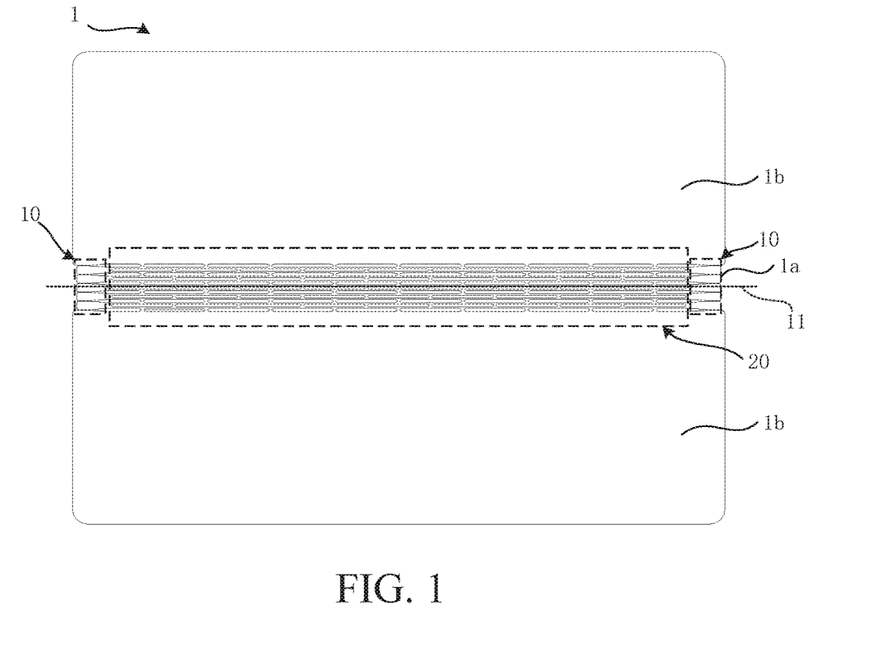
FIG. 1 is a planar structural schematic diagram of a support layer according to an embodiment of the present disclosure.

The present disclosure provides a support component 100 to support a flexible display panel. The support component 100 includes a support layer 1, and the support layer 1 includes at least one bending area 1a, and non-bending areas 1b disposed at two sides of the bending area 1a. The support layer 1 has a patterned structure in the bending area 1a. That is, the support layer 1 adopts a design combining a solid part and a hollow part to disperse stress received by the support layer 1 during a bending process, and to improve a ductility.

It should be noted that, according to the embodiment of the present disclosure, taking the support layer 1 having one bending area 1a and two non-bending areas 1b as an example for explanation. However, it should be understood that, a number of the bending area 1a can be 2 or more. Correspondingly, a number of the non-bending areas 1b can be 3 or more.

Specifically, the two non-bending areas 1b are symmetrically connected to opposite sides of the bending area 1a, and shapes and sizes of the two non-bending areas 1b are the same.

Figure 2:
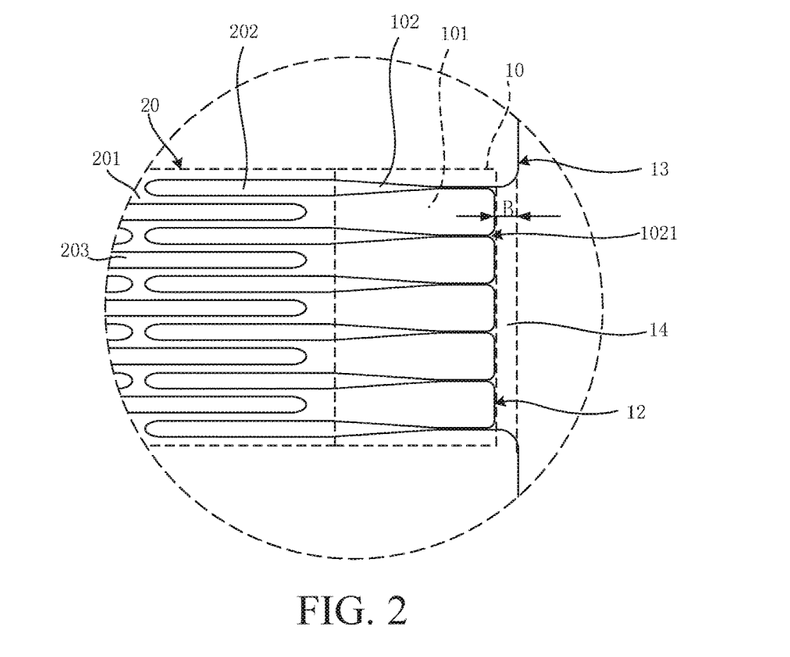
FIG. 2 is a first partial enlarged structural schematic diagram of a support layer according to an embodiment of the present disclosure.

Please refer to FIG. 2, FIG. 2 is a first partial enlarged structural schematic diagram of a support layer according to an embodiment of the present disclosure. The patterned structure includes two first edges 12 perpendicular to a bending axis 11 of the bending area 1a, and the patterned structure includes two first hollow patterns 10 respectively disposed at a corresponding first edge 12. The hollow patterns 10 comprises a plurality of support blocks 101 and a plurality of first hollow parts 102. The plurality of support blocks 101 are disposed along a direction perpendicular to the bending axis 11, and each first hollow part 102 is disposed between two adjacent support blocks 101. An opening 1021 is formed at a corresponding first edge 12 close to each first hollow part 102.

Figure 11:
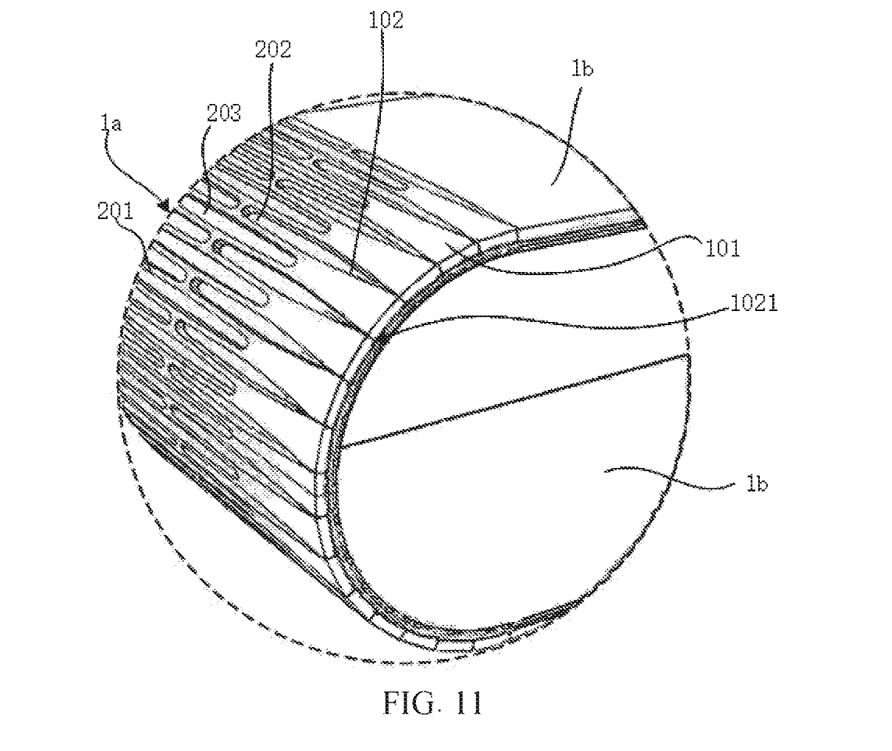
FIG. 11 is a structural schematic diagram of a support module in another bending state according to an embodiment of the present disclosure.

Please refer to FIG. 3 and FIG. 11, FIG. 3 is a structural schematic diagram of a support module in a bending state according to an embodiment of the present disclosure, and FIG. 11 is a structural schematic diagram of a support module in another bending state according to an embodiment of the present disclosure. When the support layer 1 is in the bending state, an opening 1021 shrinks to a closed state.

It should be noted that "When the support layer 1 is in a bending state, the opening 1021 shrinks to a closed state." means that the opening 1021 just closes or tends to close when the support layer 1 is in the bending state. Specifically, in one case, as shown in FIG. 11, when the opening 1021 just closes, opposite surfaces of the two adjacent support blocks 101 just touch. In another case, as shown in FIG. 3, when the opening 1021 tends to close, the opposite surfaces of the two adjacent support blocks 101 are infinitely close but not abutting. At this time, a width of the first hollow part 102 at the corresponding first edge 12 and in the direction perpendicular to the bending axis 11 is small enough, but not zero.

The present disclosure reduces a probability of water vapor and dust intruding into the flexible display module by adopting an above-mentioned design, under a premise of ensuring that the support layer 1 maintains a good ductility. In addition, for an inward-folding complete machine product, since the flexible display module is in a folded state for a long time, the flexible display module adopting the support layer 1 provided in the embodiment of the present disclosure is easier to prevent dust.

In an embodiment, a width of the first hollow part 102 in the direction perpendicular to the bending axis 11 gradually decreases along a direction approaching the corresponding first edge 12. It should be noted that, the smaller the width of the first hollow part 102 close to the first edge 12 is, the lower the probability of water vapor intrusion. By adopting a design in which the width of the first hollow part 102 in the direction perpendicular to the bending axis 11 gradually decreases, on the one hand, the probability of the water vapor and dust intruding into the flexible display module can be reduced to achieve a purpose of protecting the display module. On the other hand, that the first hollow part 102 has a transitional zoom design can balance a force of the flexible display module when bending, thereby avoiding an occurrence of fracture failure due to stress concentration.

In an embodiment, the width of the first hollow part 102 in the direction perpendicular to the bending axis 11 decreases linearly along the direction approaching the corresponding first edge 12. It should be understood that the width of the first hollow part 102 in the direction perpendicular to the bending axis 11 decreases linearly, which is beneficial to further equalize the force on the flexible display module when bending, thereby avoiding the occurrence of the fracture failure due to the stress concentration.

In an embodiment, FIG. 4 is a structural schematic diagram of a first hollow part and a second hollow part according to an embodiment of the present disclosure. The first hollow part 102 includes a first sub-hollow part 1022 and a second sub-hollow part 1023 disposed in a direction parallel to the bending axis 11 and connected to each other. The first sub-hollow part 1022 is away from the corresponding first edge 12, and the second sub-hollow part 1023 is close to the corresponding first edge 12. Wherein, in a direction close to the corresponding first edge 12, the width of the first sub-hollow part 1022 in the direction perpendicular to the bending axis 11 gradually decreases, and the width of the second sub-hollow part 1023 in the direction perpendicular to the bending axis 11 remains unchanged.

It is understood that the first sub-hollow part 1022 has a retractable structure, and the second sub-hollow part 1023 has a horizontal structure. Due to an arrangement of the second sub-hollow part 1023, the water vapor and dust need to pass through a narrow and long section to enter the first sub-hollow part 1022, which increases a difficulty for external water vapor and dust to enter the flexible display module, thereby further reducing the probability of the water vapor and dust intruding into the flexible display module.

In an embodiment, in the direction close to the corresponding first edge 12, a width of the first sub-hollow part 1022 in the direction perpendicular to the bending axis 11 is a first width, and a width of the second sub-hollow part 1023 in the direction perpendicular to the bending axis 11 is a second width. Wherein, the first width is greater than or equal to the second width. The first width gradually decreases, and the second width remains unchanged.

In an embodiment, the first hollow part 102 has a symmetrical pattern, and a symmetry axis of the first hollow part 102 is parallel to the bending axis 11. That is, in an embodiment of the present disclosure, a decreasing trend of the width of the first hollow part 102 in the direction perpendicular to the bending axis 11 remains the same at any position, which is beneficial to further make the first hollow part 102 keep symmetrical under a force when the support layer 1 is bent, so that the force of the flexible display module is balanced when the flexible display module is bent, thereby avoiding the occurrence of the fracture failure due to the stress concentration.

In an embodiment, a width Z of the first hollow part 102 at the corresponding first edge 12 and in the direction perpendicular to the bending axis 11 is less than or equal to 60 microns, which can avoid interference caused by the opposite surfaces of the two adjacent support blocks 101 pressing against each other due to the excessively large Z value, thereby avoiding defects such as squeezing and arching.

In an embodiment, the width Z of the first hollow part 102 at the corresponding first edge 12 and in the direction perpendicular to the bending axis 11 ranges from 20 microns to 60 microns. On the one hand, it is can avoid a increase of the probability of the water vapor and dust entering the flexible display module under conditions of high temperature and humidity due to a too small Z value. On the other hand, since the edge stress of the flexible display module decreases first and then increases with an increase of the Z value, designing the Z value to this range can reduce the edge stress of the flexible display module.

In an embodiment, the first hollow part 102 can be formed by a dry etching process, or a laser forming method. The width Z of the first hollow part 102 at the corresponding first edge 12 and in the direction perpendicular to the bending axis 11 is 20 microns, which is determined by a limit accuracy that can be achieved by an actual etching process at a current stage, and can meet a processing accuracy of a current stage of a process.

In an embodiment, please continue to refer to FIG. 2, the non-bending area 1b includes two second edges 13 perpendicular to the bending axis 11, and a gap 14 disposed between the first edge 12 and one second edge 13 disposed on a same side with the first edge 12. It is understood that, on a premise that a force state of the flexible display module is not affected, compared with a flush design between the bending area 1a and the non-bending area 1b of the support layer 1, the gap 14 is provided between the bending area 1a and the non-bending area 1b of the support layer 1 according to the present disclosure to make fingers or installation tools not easily touch the first edge 12 during subsequent installation, thereby reducing a probability of warping of the first edge 12 of the support layer 1, and beneficial improving an yield rate, and meeting requirements of a whole machine falling.

In an embodiment, in order to not change a force state of an edge position in a width direction of the flexible display module, the width B of the gap 14 in the direction parallel to the bending axis 11 is less than or equal to 0.75 mm. While not changing the force state of the flexible display module at the edge position, enough space can be leave to fill the glue layer to protect the first edge 12 from external force damage.

Figure 6:
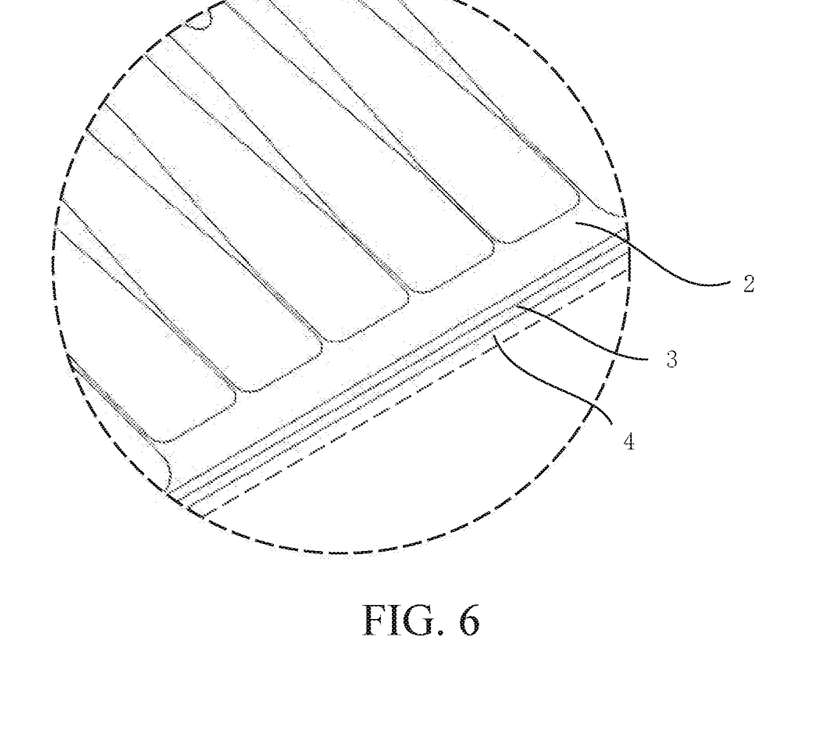
FIG. 6 is a partial enlarged structural schematic diagram of the support module in FIG. 5.

In an embodiment, please refer to FIG. 5 and FIG. 6. FIG. 5 is a structural schematic diagram of the support component according to an embodiment of the present disclosure. FIG. 6 is a partial enlarged structural schematic diagram of the support module in FIG. 5. The gap 14 is filled with a glue layer 2 with low moisture permeability and low modulus properties. On the one hand, the glue layer 2 serves as a buffer and can protect the first edge 12 from being damaged. On the other hand, the glue layer 2 made of waterproof gel has a waterproof performance, and can encapsulate and seal the first edge 12 to achieve a reliable water vapor barrier effect and a good protection effect.

In an embodiment, the glue layer 2 is made of a material with lower moisture permeability, an oxygen permeability, and a lower elastic modulus.

In an embodiment, an elastic modulus E of the glue layer 2 is between 0.05 MPa (megapascals) and 0.2 MPa.

In an embodiment, the glue layer 2 can be a silicone-based grease viscous oil film or a lithium-based grease oil film.

In an embodiment, please continue to refer to FIG. 4, in the direction parallel to the bending axis 11, a length L2 of the second hollow part 202 is greater than or equal to a length L1 of the first hollow part 102, Moreover, the length L2 of the second hollow part 202 is less than or equal to 1.2 times the length L1 of the first hollow part 102. On the one hand, considering the processing accuracy, the length of the first hollow part 102 should not be too long to reduce a difficulty of processing a narrow first sub-hollow part 1022. On the other hand, under a premise of ensuring that the support layer 1 has the good ductility at the first edge 12, the probability of the water vapor and dust in the external environment intruding into the flexible display module can be reduced. In the direction perpendicular to the bending axis 11, a maximum width of the first hollow part 102 is not greater than the width of the second hollow part 202, so that the first hollow part 102 in a retracted state as a whole compared to the second hollow part 202.

In an embodiment, in the direction parallel to the bending axis 11, the length L1 of the first hollow part 102 is 2 microns.

In an embodiment, in the direction perpendicular to the bending axis 11, the maximum width of the first hollow part 102 is not greater than the width of the second hollow part 202.

In an embodiment, the width W of the second hollow part 202 in the direction perpendicular to the bending axis 11 is ranges from 180 μm to 220 μm. On the one hand, a W value is avoided to be designed to be too small, so that the width of the first hollow part 102 in the direction perpendicular to the bending axis 11 has enough space for reduction. On the other hand, since the edge stress of the flexible display module increases with a increase of the W value, that the W value is designed to this range can reduce the edge stress of the flexible display module.

In an embodiment, the second hollow part 202 includes a first arc hollow part 2021 and a first strip hollow part 2022 that are sequentially disposed in the direction parallel to the bending axis 11 and communicate with each other. The first strip hollow part 2022 is provided between the first arc hollow part 2021 and the first hollow part 102. A shape of the first arc hollow part 2021 is semi-elliptical, and a shape of the first strip hollow part 2022 is rectangular. Of course, the second hollow part 202 can also have other shapes, and the embodiment of the present disclosure is not limited thereto.

It should be noted that a geometric size relationship between the first hollow part 102 and the second hollow part 202, including the width Z of the first hollow part 102 at the corresponding first edge 12 and in the direction perpendicular to the bending axis 11, the width B of the gap 14 in the direction parallel to the bending axis 11, and the width W of the second hollow part 202 in the direction perpendicular to the bending axis 11, will affect a change of an edge force and a shape of the support layer 1 to a certain extent. Therefore, it is very necessary to determine an appropriate range for geometric dimensions of the first hollow part 102 and the second hollow part 202.

Specifically, the smaller the value of the width Z of the first hollow part 102 at the corresponding first edge 12 and in the direction perpendicular to the bending axis 11, the narrower the opening 1021. So the probability of the water vapor and dust intruding into the flexible display module under the conditions of high temperature and high humidity is smaller. However, a determination of the Z value range is also related to the value of the width W of the second hollow part 202 in the direction perpendicular to the bending axis 11. If a Z value does not match the W value, the stress of the support layer 1 in a flattened state and the bending state is completely different. For example, when the support layer 1 is in the bending state, relative surfaces of the two adjacent support blocks 101 are pressed against each other, which is prone to interference and extrusion arching, and has a great impact on the edge force of the flexible display module, and even directly leads to the failure of the flexible display module from an edge section under extreme conditions. In addition, a determination of Z value range is also limited by an accuracy of an actual process. For example, limited by a processing accuracy of a current etching process, the smaller the Z value, the lower a process yield, or even unable to process.

Considering an actual stress on an edge of the flexible display module, the applicant carries out combined size optimization through simulation analysis. Taking the stress on the edge of the flexible display module as a reference, the stress on the edge of the flexible display module is simulated by changing the W value and the Z value. When the stress on the edge of the flexible display module is the smallest, optimal W value and Z value are determined.

Figure 7:
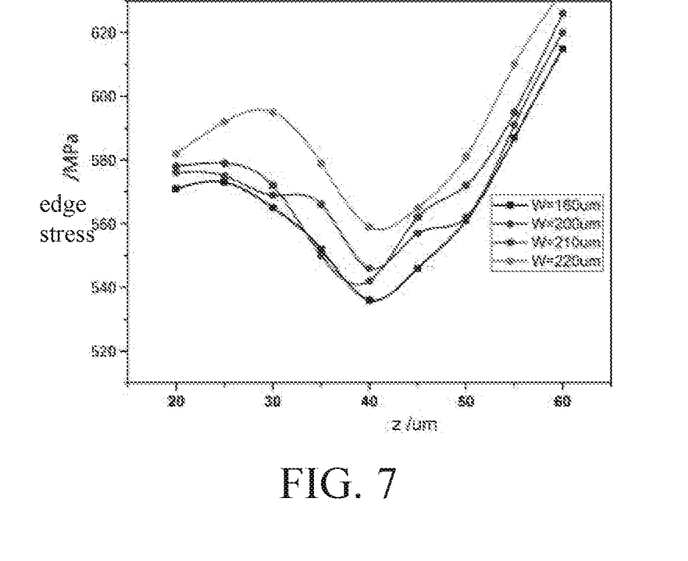
FIG. 7 is a corresponding relationship diagram of a W value, a Z value, and an edge stress value according to an embodiment of the present disclosure.

Please refer to FIG. 7, FIG. 7 is a corresponding relationship diagram of the W value, the Z value, and an edge stress value according to an embodiment of the present disclosure. A simulation results show that the larger the W value is, a corresponding edge stress of the flexible display module gradually increases, that is, the smaller the W value is, the more favorable it is to alleviate the edge stress of the flexible display module. The edge stress of the flexible display module decreases first and then increases with the Z value. When the Z value is 40 microns, the edge stress of the flexible display module can reach a better value.

In one embodiment, in combination with FIG. 1 and FIG. 2, in order to more evenly disperse the stress of the support layer 1 in the bending process, and make the support layer 1 has a better ductility in the bending area 1a, the bending area 1a of the support layer 1 is further provided with a second hollow pattern 20, and the second hollow pattern 20 is disposed in a middle area of the bending area 1a in an embodiment of the present disclosure. Thus, the ductility of the flexible display module applying the support component 100 can be improved as a whole to ensure that a deformation adaptability, and a coordination between the support layer 1 and functional film layers of the flexible display module are guaranteed, so as to improve a bending performance of the flexible display module, reduce a risk of debonding and fracture between film layers, and improve a bending service life of the flexible display module, and a production yield of the product.

Figure 8:
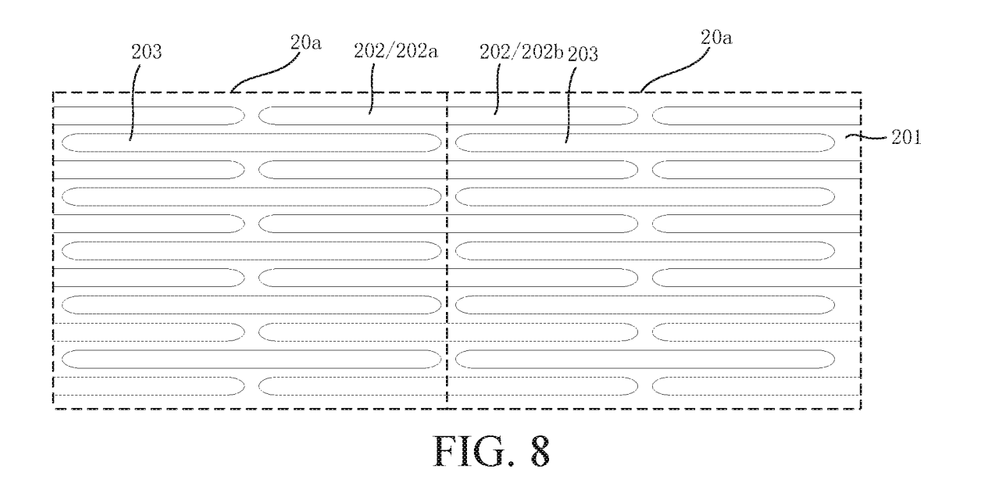
FIG. 8 is a second partial enlarged structural schematic diagram of the support layer according to an embodiment of the present disclosure.

Specifically, please refer to FIG. 8, FIG. 8 is a second partial enlarged structural schematic diagram of the support layer according to an embodiment of the present disclosure. Two ends of the second hollow pattern 20 are respectively connected with a first hollow pattern 10. The second hollow pattern 20 includes a plurality of sub hollow patterns 20a repeatedly disposed, and each sub hollow pattern 20a includes a main body part 201 and a plurality of second hollow parts 202. Wherein, the second hollow part 202 in the sub hollow pattern 20a connected to the first hollow pattern 10 is connected to the first hollow part 102 in a corresponding first hollow pattern 10 one by one.

Specifically, the second hollow parts 202 of two adjacent sub hollow patterns 20a are connected one by one. For a clear description, take the second hollow part on the left of the sub hollow pattern 20a in FIG. 8 is 202a and the second hollow part on the right of the sub hollow pattern 20a is 202b as an example. A side of the second hollow part 202a towards the second hollow part 202b is non-closed, and a side of the second hollow part 202b towards the second hollow part 202a is non-closed. The side of the second hollow part 202a towards the second hollow part 202b is connected to the side of the second hollow part 202b towards the second hollow part 202a.

In an embodiment, in order to further improve the ductility of the support layer 1, each sub hollow pattern 20a also includes a plurality of third hollow parts 203. In the direction perpendicular to the bending axis 11, the third hollow parts 203 and the second hollow parts 202 in each sub hollow pattern 20a are disposed alternately, and each third hollow part 203 corresponds to two second hollow parts 202 disposed at intervals.

Figure 9:
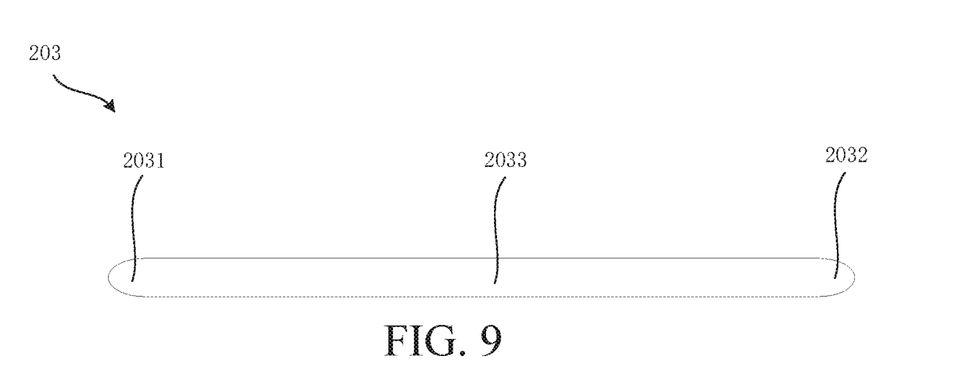
FIG. 9 is a structural schematic diagram of a third hollow part according to an embodiment of the present disclosure.

In an embodiment, please refer to FIG. 9, FIG. 9 is a structural schematic diagram of a third hollow part according to an embodiment of the present disclosure. The third hollow part 203 includes a second arc hollow part 2031 and a third arc hollow part 2032 respectively disposed at both ends, and a second strip hollow part 2033 disposed between the second arc hollow part 2031 and the third arc hollow part 2032. A shape and size of the second arc hollow part 2031 and the third arc hollow part 2032 are the same as those of the first arc hollow part 2021, In a direction perpendicular to the bending axis 11, the width of the second strip hollow part 2033 is equal to a width of the first strip hollow part 2022.

In an embodiment, hollow parts of the first hollow pattern 10 and the second hollow pattern 20 are filled with the glue layer 2 with low moisture permeability and low modulus properties.

Specifically, the first hollow part 102, the second hollow part 202 and the third hollow part 203 are also filled with the adhesive layer 2 with low moisture permeability and low modulus properties. The glue layer 2 needs to be leveled after filling.

In an embodiment, the glue layer 2 can be filled in the second hollow part 202 and the third hollow part 203 by coating.

In an embodiment, material of the glue layer 2 filled in the second hollow part 202 and the third hollow part 203 can be the same as that of the glue layer 2 filled in the gap 14.

In an embodiment, please continue to refer to FIG. 5 and FIG. 6. The support component 100 also includes a protection film 3 disposed on a side of the support layer 1 away from the flexible display panel, and the protection film 3 covers at least a part of the support layer 1 corresponding to the bending area 1a.

In an embodiment, the material of the protection film 3 can be a material with good wear resistance, oil resistance and corrosion resistance. At a high temperature of 120° C., the protection film 3 does not shrink and has good elasticity.

In an embodiment, the material of the protection film 3 can be a thermoplastic polyurethane elastic colloid material, but is not limited thereto.

In an embodiment, the support component 100 also includes a reinforcing layer 4 disposed on a side of the protection film 3 away from the support layer 1. The reinforcing layer 4 can conduct a secondary sealing treatment on the support layer 1 by coating the glue layer with low moisture permeability and low modulus properties on the side of the protection film 3 away from the support layer 1, so as to reduce way of water vapor invading the flexible display module, and further reduce the probability of water vapor invading the flexible display module. Specifically, material of the reinforcing layer 4 can be the same as that of the glue layer 2 filled in the first hollow part 102, the second hollow part 202, the third hollow part 203 and the gap 14.

It can be understood that relevant data provided in the embodiment of the present disclosure has been applied to an actual production, and a finite element simulation analysis technology and a cloud diagram for simulating the bending force of the support layer 1 are adopted. Specifically, an embodiment of the present disclosure changes a structural morphology of an edge position of the bending area 1a of the support layer 1. The support layer 1 adopts a design of the patterned structure. Through simulation verification, a maximum stress received by the support layer 1 is 526.9 MPa. A stress value is within its fatigue strength range, and is far lower than a strength limit value of its selected material strength of 1600 MPa, which shows that adopting this design method will not affect a force state of the flexible display module. In addition, the simulation results can prove that the probability of the water vapor and dust entering the flexible display module through the opening 1021 under high temperature and high humidity conditions can be effectively reduced, which is beneficial to improve the life of the flexible display module.

Figure 10:
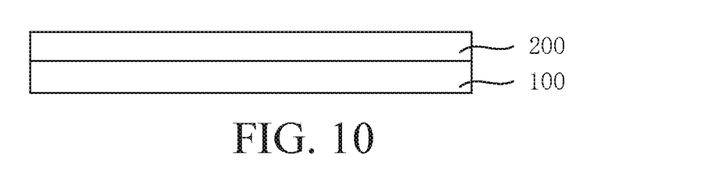
FIG. 10 is a cross-sectional structural schematic diagram of the flexible display module according to an embodiment of the present disclosure.

Please refer to FIG. 10, FIG. 10 is a cross-sectional structural schematic diagram of the flexible display module according to an embodiment of the present disclosure. The flexible display module provided by the embodiment of the present disclosure includes a flexible display panel 200 and the support component 100 in above-mentioned embodiments. Wherein the support component 100 is located on one side of the flexible display panel 200 and is configured to support the flexible display panel 200.

The beneficial effects are: the support component and the flexible display module provided by the present disclosure. The support component includes the support layer. The support layer has the patterned structure in the bending area. The patterned structure includes two first hollow patterns respectively disposed at the first edge, and the first hollow pattern includes a plurality of support blocks and a plurality of first hollow parts. The plurality of support blocks are disposed along the direction perpendicular to the bending axis. Each first hollow part is disposed between two adjacent support blocks, and each first hollow part forms the opening near the adjacent first edge. When the support layer is in the bending state, the opening shrinks to close, thereby reducing the probability of the water vapor and dust intruding into the flexible display module when the flexible display module is bent, and improving a display life of the flexible display module.

In summary, although the disclosure has been disclosed as above in preferred embodiments, above-mentioned preferred embodiments are not intended to limit the disclosure. Those of ordinary skill in the art can make various changes and modifications without departing from the spirit and scope of this disclosure. Therefore, a protection scope of this disclosure is subject to the scope defined by the claims.

What is claimed is:

1. A support component for supporting a flexible display panel, wherein the support component comprises:
   a support layer, the support layer comprising:
   at least one bending area, and
   non-bending areas disposed between two sides of the bending area, wherein the at least one bending area is disposed between the non-bending areas;
   wherein the support layer has a patterned structure in the bending area, and the patterned structure comprises:
   two first edges perpendicular to a bending axis of the bending area, and
   two first hollow patterns respectively disposed at the two first edges, wherein the hollow patterns comprise a plurality of support blocks and a plurality of first hollow parts, and the plurality of support blocks are disposed along a direction perpendicular to the bending axis; and each of the plurality of first hollow parts is disposed between two adjacent support blocks, and an opening is formed at a corresponding first edge close to each of the plurality of first hollow parts;
   wherein the first hollow part comprises a first sub-hollow part and a second sub-hollow part disposed in a direction parallel to the bending axis and connected to each other, wherein the first sub-hollow part is away from the corresponding first edge, and the second sub-hollow part is close to the corresponding first edge;
   a maximum width of the first sub-hollow part in a direction perpendicular to the bending axis is a first width, and a maximum width of the second sub-hollow part in a direction perpendicular to the bending axis is a second width, the first width is greater than or equal to the second width;
   in a direction close to the corresponding first edge, widths of the first sub-hollow part gradually decreases in the direction perpendicular to the bending axis, and widths of the second sub-hollow part remain unchanged in the direction perpendicular to the bending axis; and
   when the support layer is in a bending state and the opening closes, opposite surfaces of the two adjacent support blocks are in direct touch.

2. The support component as claimed in claim 1, wherein the width of the first hollow part in the direction perpendicular to the bending axis decreases linearly along the direction approaching the corresponding first edge.

3. The support component as claimed in claim 1, wherein the first hollow part has a symmetrical pattern, and a symmetry axis of the first hollow part is parallel to the bending axis.

4. The support component as claimed in claim 1, wherein a width of the first hollow part at the corresponding first edge and in a direction perpendicular to the bending axis is less than or equal to 60 microns.

5. The support component as claimed in claim 4, wherein the width of the first hollow part at the corresponding first edge and in the direction perpendicular to the bending axis ranges from 20 microns to 60 microns.

6. The support component as claimed in claim 1, wherein the non-bending area comprises two second edges perpendicular to the bending axis, and a gap disposed between the first edge and one second edge disposed on a same side with the first edge.

7. The support component as claimed in claim 6, wherein a width of the gap in a direction parallel to the bending axis is less than or equal to 0.75 mm.

8. The support component as claimed in claim 6, wherein the gap is filled with a glue layer with low moisture permeability and low modulus properties.

9. The support component as claimed in claim 1, wherein the patterned structure further comprises a second hollow pattern, and two ends of the second hollow pattern are respectively connected to one first hollow pattern.

10. The support component as claimed in claim 9, wherein the second hollow pattern comprises a plurality of sub-hollow patterns repeatedly disposed along the bending axis.

11. The support component as claimed in claim 10, wherein each of the plurality of sub-hollow patterns comprises a main body part and a plurality of second hollow parts, wherein the plurality of second hollow parts in each of the plurality of sub-hollow patterns connecting a corresponding first hollow pattern are in one-to-one correspondence with the plurality of first hollow parts in the corresponding first hollow pattern, and the plurality of second hollow parts in two adjacent sub-hollow patterns are connected in one-to-one correspondence.

12. The support component as claimed in claim 11, wherein in a direction parallel to the bending axis, a length of the second hollow part is greater than or equal to a length of the first hollow part, and the length of the second hollow part is less than or equal to 1.2 times the length of the first hollow part;
wherein in a direction perpendicular to the bending axis, a maximum width of the first hollow part is not greater than a width of the second hollow part.

13. The support component as claimed in claim 11, wherein a width of the second hollow part in a direction perpendicular to the bending axis ranges from 180 microns to 220 microns.

14. The support component as claimed in claim 11, wherein each of the plurality of sub-hollow patterns further comprises a plurality of third hollow parts; and
wherein in a direction perpendicular to the bending axis, the plurality of third hollow parts and the plurality of second hollow parts in each of the plurality of sub-hollow patterns are alternately disposed, and each of the plurality of third hollow parts corresponds to two second hollow parts disposed at intervals.

15. The support component as claimed in claim 9, wherein hollow parts of the first hollow pattern and the two second hollow patterns are filled with a glue layer with low moisture permeability and low modulus properties.

16. The support component as claimed in claim 1, wherein the support component further comprises a protective film, and the protective film is disposed on a side of the support layer away from the flexible display panel, and covers at least part of the support layer corresponding to the bending area.

17. The support component as claimed in claim 16, wherein the support component further comprises a reinforcement layer disposed on a side of the protective film away from the support layer.

18. The support component as claimed in claim 1, wherein when the support layer is in a bending state and the opening tends to close, a gap is defined between opposite surfaces of the two adjacent support blocks, and the widths of the second sub-hollow part in a bending state in the direction perpendicular to the bending axis are less than widths of the second sub-hollow part in a non-bending state in the direction perpendicular to the bending axis.

19. A flexible display module comprising:
a flexible display panel; and
a supporting component disposed on one side of the flexible display panel and configured to support the flexible display panel, and the supporting component comprises:
a support layer, the support layer comprising:
at least one bending area, and
non-bending areas disposed between two sides of the bending area, wherein the at least one bending area is disposed between the non-bending areas;
wherein the support layer has a patterned structure in the bending area, and the patterned structure comprises:
two first edges perpendicular to a bending axis of the bending area, and
two first hollow patterns respectively disposed at the two first edges, wherein the hollow patterns comprise a plurality of support blocks and a plurality of first hollow parts, and the plurality of support blocks are disposed along a direction perpendicular to the bending axis, and each of the plurality of first hollow parts is disposed between two adjacent support blocks, and an opening is formed at a corresponding first edge close to each of the plurality of first hollow parts;
wherein the first hollow part comprises a first sub-hollow part and a second sub-hollow part disposed in a direction parallel to the bending axis and connected to each other, wherein the first sub-hollow part is away from the corresponding first edge, and the second sub-hollow part is close to the corresponding first edge;
a maximum width of the first sub-hollow part in a direction perpendicular to the bending axis is a first width, and a maximum width of the second sub-hollow part in a direction perpendicular to the bending axis is a second width, the first width is greater than or equal to the second width;
in a direction close to the corresponding first edge, widths of the first sub-hollow part gradually decreases in the direction perpendicular to the bending axis, and widths of the second sub-hollow part remain unchanged in the direction perpendicular to the bending axis; and when the support layer is in a bending state and the opening closes, opposite surfaces of the two adjacent support blocks are in direct touch.

* * * * *